US007354781B2

(12) United States Patent
Park et al.

(10) Patent No.: US 7,354,781 B2
(45) Date of Patent: Apr. 8, 2008

(54) METHOD OF MANUFACTURING FIELD EMISSION DEVICE

(75) Inventors: Shang-Hyeun Park, Boryeong-si (KR); Young-Hwan Kim, Wilmington, DE (US)

(73) Assignees: Samsung SDI Co., Ltd., Suwon-si, Gyeonggi-do (KR); E.I. Du Pont De Nemours and Company, Wilmington, DE (US)

( * ) Notice: Subject to any disclaimer, the term of this patent is extended or adjusted under 35 U.S.C. 154(b) by 126 days.

(21) Appl. No.: 11/435,285

(22) Filed: May 17, 2006

(65) Prior Publication Data

US 2006/0275966 A1 Dec. 7, 2006

(30) Foreign Application Priority Data

May 18, 2005 (KR) ..................... 10-2005-0041760

(51) Int. Cl.
*H01L 21/00* (2006.01)

(52) U.S. Cl. ........................ 438/20; 438/708; 438/780; 438/951; 257/10; 257/144; 257/E21.023; 257/E21.026

(58) Field of Classification Search ................ 438/708, 438/947; 257/144, 152, E21.023, E21.024, 257/E21.487, E21.492

See application file for complete search history.

(56) References Cited

U.S. PATENT DOCUMENTS 4,529,686 A * 7/1985 Kraus ......................... 430/314
5,091,342 A * 2/1992 Studebaker et al. ........ 438/577
6,794,112 B2 * 9/2004 Nozaki et al. ........... 430/270.1

OTHER PUBLICATIONS

"*Controlled/Living Radical Polymerization*", edited by K. Matyjaszewski, Oxford University Press.

"*Polymer Chemistry*", Fifth Edition by C.E. Carraher Jr., Marcel Dekker Inc., New York, New York. (See Chapters 7,8 and 9).

"*Polymers*" by S.L. Rosen in The Kirk-Othmer Encyclopedia of Chemical Technology, Fourth Edition, John Wiley and Sons Inc., New York. (See vol. 19, pp. 899-901).

J.V. Crivello, "*The Chemistry of Photoacid Generating Compounds*" in Polymeric Materials Science and Engineering, vol. 61, American Chemical Society Meeting, Miami, Fl., Sep. 11-15, 1989, pp. 62-66.

* cited by examiner

*Primary Examiner*—Michael Lebentritt
*Assistant Examiner*—Cheung Lee
(74) *Attorney, Agent, or Firm*—Robert E. Bushnell, Esq.

(57) ABSTRACT

A method of manufacturing a field emission device (FED) using a photoresist for performing multi-patterning processes, whereby different structures can be multi-patterned using a single photoresist mask. The photoresist has a solubility to a solvent by post-exposure heat-treatment, and a complicated structure can be formed using the photoresist.

20 Claims, 12 Drawing Sheets

PR Exposure

1st PR Pattern

Cr etching

Insulator etching

2nd Exposure $2^{nd}$ Pattern $2^{nd}$ Etching

METHOD OF MANUFACTURING FIELD EMISSION DEVICE

CROSS-REFERENCE TO RELATED PATENT APPLICATION AND CLAIM OF PRIORITY

This application claims the benefit of Korean Patent Application No. 10-2005-0041760, filed on May 18, 2005, in the Korean Intellectual Property Office, the disclosure of which is incorporated herein in its entirety by reference. This application is related to application serial number (to be determined) filed on the same date as this application, entitled "METHOD OF FORMING STACK LAYER AND METHOD OF MANUFACTURING ELECTRONIC DEVICE HAVING THE SAME", the disclosure of which is incorporated herein by reference.

BACKGROUND OF THE INVENTION

1. Field of the Invention

The present invention relates to a method of manufacturing a field emission device (FED), and more particularly, to a method of manufacturing a FED using a mask for performing multiple exposure to light and multi-patterning processes.

2. Description of the Related Art

In general, thin films or thick films forming stacked structures for electronic devices are processed using physical, chemical, or physical-chemical methods. Here, masks for patterning processing target materials to have desired shapes are used.

In general, a mask is directly deposited to a processing target material, and is formed with a photoresist of a light-hardened or light-softened polymer. According to a conventional method, a conventional mask is formed through a series of processes such as photoresist coating, soft baking, exposing, developing, and hard baking, and the mask cannot be altered when these processes are finished. Accordingly, the conventional mask is used only once, and thus a new mask needs to be formed if the stacked structure requires an additional etching process for forming a new pattern.

Since the conventional photolithography process includes many operational units, they should be simplified when considering manufacturing costs and productivity.

SUMMARY OF THE INVENTION

The present invention provides a method of forming a stacked structure in an electronic device in which a single mask can be used several times and a method of manufacturing a FED using the single mask.

The present invention also provides a method of forming a stacked structure in an electronic device using a positive photoresist formed of a polymer which includes a pendant acid labile group and a method of manufacturing a FED using the single mask.

According to an aspect of the present invention, there is provided a method of forming a stacked structure in an electronic material, including: preparing a structure comprising a substrate, a cathode on the substrate, a gate electrode having a through-hole, and a gate insulation layer disposed between the cathode and the gate electrode and having a gate hole corresponding to the through-hole; forming a sacrificial layer by coating a positive photoresist having polymers on the precursor, the polymers comprising at least 50 mole % of monomers having structures selected from the group consisting of Formulae 1 through 3; forming a photomask on a position of the sacrificial layer corresponding to the gate hole; exposing a portion of the sacrificial layer uncovered by the photomask to light; forming a well in the sacrificial layer by etching the unexposed portion of the sacrificial layer covered by the photomask using one of TCE and $CH_2Cl_2$ solvents; filling the well by applying an electron emitting material paste which is able to be hardened by light to the sacrificial layer; hardening a lower portion of the electron emitting material paste filled in the well by radiating light from the bottom of the substrate; and forming an electron emitting material layer on the cathode by removing the sacrificial layer and the unexposed electron emitting material paste:

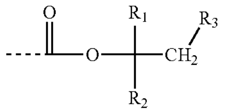

(1)

where $R_1$ is hydrogen or an alkyl group having 1 to 6 linear or cyclic carbon atoms, $R_2$ is an alkyl group having 1 to 6 linear or cyclic carbon atoms, and $R_3$ is hydrogen or an alkyl group having 1 to 6 linear or cyclic carbon atoms;

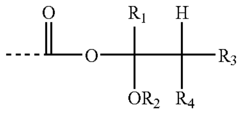

(2)

where $R_1$ is hydrogen or an alkyl group having 1 to 6 linear or cyclic carbon atoms, $R_2$ is an alkyl group having 1 to 6 linear or cyclic carbon atoms, and $R_3$ and $R_4$ are independently hydrogen or an alkyl group having 1 to 6 linear or cyclic carbon atoms, and the joining of $R_1$ and $R_2$, or $R_1$ and either $R_3$ or $R_4$, or $R_2$ and either $R_3$ or $R_4$ forms a 5-, 6-, or 7-membered ring; and

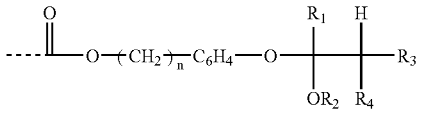

(3)

where $R_1$ is hydrogen or an alkyl group having 1 to 6 linear or cyclic carbon atoms, $R_2$ is an alkyl group having 1 to 6 linear or cyclic carbon atoms, and $R_3$ and $R_4$are independently hydrogen or an alkyl group having 1 to 6 linear or cyclic carbon atoms, and the joining of $R_1$ and $R_2$, or $R_1$ and either $R_3$ or $R_4$, or $R_2$ and either $R_3$ or $R_4$ forms a 5-, 6-, or 7-membered ring.

According to another aspect of the present invention, there is provided a method of forming an electron emitting material layer in an electronic device having a multi-layer structure, including: preparing the multi-layer structure, the multi-layer structure comprising a cathode formed on the substrate, a first layer on the cathode, and a second layer on the first layer, the first layer having a first hole exposing a portion of the cathode, the second layer having a second hole corresponding to the first hole; applying photoresist to the multi-layer structure to form a photoresist layer which is formed on the second layer and fills the first hole and the second hole, the photoresist having polymers comprising at least 50 mole % of monomers having structures selected from the group consisting of Formulae 1 through 3; first baking the photoresist layer at a first temperature range; positioning a photomask on the photoresist layer at a position above the exposed portion of the cathode; exposing the photoresist layer to light; second baking the photoresist layer at a second temperature range; removing an unexposed portion of the photoresist layer to form a well in the photoresist layer; filling the well by applying an electron emitting material paste which is able to be hardened by light; hardening a lower portion of the filled electron emitting material paste by radiating light from the bottom of the substrate; and removing the photoresist layer and the unexposed electron emitting material paste to form an electron emitting material layer on the cathode.

The polymer in the photoresist may be selected from the group consisting of 1-ehtoxyethyl methacrylate, 1-ehtoxyethyl acrylate, 1-butoxyethyl methacrylate, 1-butoxyethyl acrylate, 1-ethoxy-1-propyl methacrylate, 1-ethoxy-1-propyl acrylate, tetrahydropyranyl methacrylate, tetrahydropyranyl acrylate, tetrahydropyranyl p-vinylbenzoate, 1-ethoxy-1-propyl p-vinylbenzoate, 4-(2-tetrahydropyranyloxy)benzyl methacrylate, 4-(2-tetrahydropyranyloxy)benzyl acrylate, 4-(1-butoxyethoxy)benzyl methacrylate, 4-(1-butoxyethoxy)benzyl acrylate, t-butyl methacrylate, t-butyl acrylate, neopentyl methacrylate, neopentyl acrylate, 1-Bicyclo{2,2,2}octyl methacrylate (or acrylate) and their derivatives, 1-Bicyclo{2,2,1}heptyl methacrylate (or acrylate) and their derivatives, 1-Bicyclo{2,1,1}hexyl methacrylate (or acrylate) and their derivatives, 1-Bicyclo{1,1,1}pentyl methacrylate (or acrylate) and their derivatives, and 1-adamantyl methacrylate (or acrylate) and their derivatives.

The photoresist may further include 0.5 to 30 mole % of photoacid generator and 10 to 1,000 ppm of photosensitizer.

According to a further aspect of the present invention, there is provided a method of forming a field emission device, comprising: preparing a precursor of the field emission device, the precursor comprising a substrate, a cathode on the substrate, a gate electrode having a through-hole, and a gate insulation layer disposed between the cathode and the gate electrode and having a gate hole corresponding to the through-hole, the gate hole having a trapezoidal-shape in a sectional view, a top portion of the gate hole being wider than a bottom portion of the gate hole, the upper portion of the gate hole having a larger diameter than the through-hole; forming a sacrificial layer to cover the gate electrode and fill the gate hole and the through-hole, the sacrificial layer comprising polymers on the structure, the polymers comprising at least 50 mole % of monomers having structures selected from the group consisting of Formulae 1 through 3; soft-baking the sacrificial layer at a first temperature range; positioning a photomask on a position of the sacrificial layer corresponding to the bottom of the gate hole; exposing a portion of the sacrificial layer uncovered by the photomask to light; hard-baking the sacrificial layer at a second temperature range; developing the unexposed portion of the sacrificial layer covered by the photomask using one of TCE and $CH_2Cl_2$ solvents to form a well in the sacrificial layer; filling the well by applying an electron emitting material paste including a light-hardened photoresist to the sacrificial layer; hardening a lower portion of the electron emitting material paste filled in the well by radiating light from the bottom of the substrate; and removing the sacrificial layer and the unexposed electron emitting material paste to form an electron emitting material layer on the cathode.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described more fully with reference to the accompanying drawings, in which exemplary embodiments of a method of forming a stacked structure in an electronic device and a method of manufacturing a field emission device (FED) using the same according to the present invention are described in detail.

Figure 1:
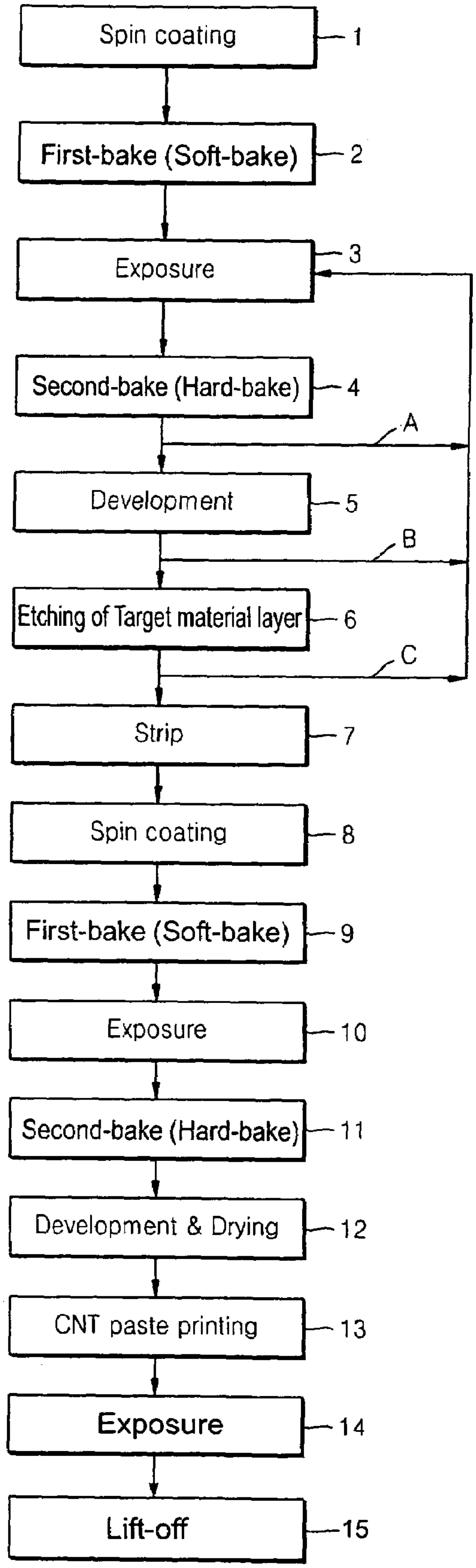
FIG. 1 is a flowchart illustrating a method of forming a stacked structure in a field emission device (FED), according to an embodiment of the present invention.

FIG. 1 is a block diagram illustrating a method of forming a stacked structure in an electronic device according to an embodiment of the present invention.

The photoresist used in embodiments of the present invention includes a polymer having a pendant acid labile group, and is not decomposed or dissolved when contacting high boiling point ester-based or ether-based solvents such as butyl carbitol, butyl carbitol acetate, dibutyl carbitol, dibutyl phthalate, texanol, and terpineol, but has a solubility after the exposure to light. Such a photoresist will be described later in detail. In particular, the photoresist become a positive photoresist with respect to $Na_2\ CO_3$ to have a solubility in $Na_2CO_3$ only by exposure to light. However, the photoresist become a negative photoresist with respect to a non-polarity solvent such as trichloroethylene (TCE) or $CH_2Cl_2$, an exposed portion of the photoresist having an insolubility in the non-polarity solvent by exposure and baking, but an unexposed portion of the photoresist having a solubility in the non-polarity solvent. Since the characteristics of the photoresist vary depending on the etchant used, the photoresist can be used to manufacture FEDs economically and effectively using these dual characteristics.

First, the above-described positive photoresist having a solubility only by exposure to light is coated to a predetermined thickness on a substrate in operation 1. At least two processing target material layers which can be films obtained by the photoresist, that is, predetermined material layers which will be patterned using an etching process using an etch mask, are formed on the substrate. In the present embodiment of the present invention, the photoresist is spin coated, but the present invention is not limited thereto.

The coated photoresist film is baked (or heat-treated) at a predetermined temperature in operation 2, which is referred to as a first baking process (or a first heat-treatment). The first baking process is typically soft baking. The first baked photoresist film is exposed to light with a predetermined pattern in operation 3. As described above, since the photoresist is positive, a portion to be removed by developing is exposed. The exposure pattern corresponds to en etch region of the processing target material layer.

The exposed photoresist film is baked (or heat-treated) at a predetermined temperature in operation 4 which is referred to as a second baking process (or a second heat-treatment). After the second baking process, the photoresist film is developed, an etch window corresponding to the etch region of the processing target material layer is formed on the photoresist film in operation 5.

After forming the etch window for the photoresist film in operation 5, the processing target material layer is etched using the etch window, and a well or a hole is formed in the processing target material layer in operation 6. In case of a field emission device, the processing target material layer corresponds to a gate insulation layer in a FED, and the well corresponds to a hole in a gate insulation layer exposing a cathode electrode in a FED.

After etching the processing target material layer, that is, the gate insulation layer, the photoresist film is removed by stripping in operation 7.

A sacrificial layer is coated with a predetermined thickness on the processing target material layer (i.e., the gate insulation layer) for performing lift-off by the positive photoresist having a solubility only by exposure to light in operation 8. In the present embodiment of the present invention, the photoresist is spin-coated, but the present invention is not limited to this.

The sacrificial layer is first baked at a predetermined temperature in operation 9. As described above, the first baking process is typically soft baking. The first based sacrificial layer is exposed to light to have a predetermined pattern in operation 10. As described above, since the sacrificial layer is a positive photoresist, a portion to be removed by developing is exposed to light. The exposure pattern corresponds to en etch region of the processing target material layer. In the present invention, the etch region corresponds to a gate hole in a FED.

The exposed sacrificial layer is second baked at a predetermined temperature in operation 11. After the second baking process, the sacrificial layer is developed using an etchant such that an etch window corresponding to an etch region in the processing target material layer is formed on the sacrificial layer in operation 12. The etch window corresponds to a formation region of an electron emitting material layer which is formed on the bottom of the gate hole.

After operation 12, a photoresist having dispersed electron emitting materials (e.g., carbon nanotube paste) is coated onto the entire surface of the substrate to fill the etch window with the electron emitting materials in operation 13.

By performing an exposure from the bottom of the substrate in operation 14, the lower portion of the electron emitting material layer in the etch window is exposed to light, and lift-off is performed in operation 15, and thus the electron emitting material layer is formed to have a predetermined height in the bottom of the hole of the gate insulation layer.

After the second exposure to light, according to the characteristics of the present invention, exposure and baking operations can be repeatedly performed for the mask layer through steps A, B, and/or C in FIG. 1. The processes can be performed a predetermined number of times. According to the present embodiment of the present invention, unlike the conventional method, a photoresist ensuring multiple exposures and multiple patterning is used, such that a structure having a complicated pattern can be obtained using the multi-exposure and the multi-patterning. Operations 1 through 7 may be substituted by a method of manufacturing a FED using a conventional photoresist.

In the method according to the present embodiment of the present invention, a photoresist has either low solubility in a high boiling point ester-based or ether-based solvent vapor or improved compatibility. The polymer in the photoresist used in the method according to the present embodiment of the present invention is impervious to ester group or ether group organic solvent during either chemical treatment or photo irradiation. The polymer is mixed with a photo responsive agent to react light. A polymer for this function may contain a labile pendant group on a side acid functional group, and the labile pendant group can be removed from the side acid functional group at an appropriate time.

One type of pendant acid labile group used for the photoresist in the present invention can be represented by the formulae:

(1)

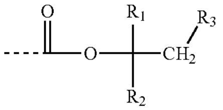

where $R_1$ is hydrogen or a lower alkyl; $R_2$ is a lower alkyl; and $R_3$ is hydrogen or a lower alkyl, where the definition of lower alkyl includes alkyl groups having 1 to 6 linear or cyclic carbon atoms.

Some examples of acid labile monomeric compounds that fall within the scope of the present invention when used to prepare the polymer are t-butyl methacrylate (or acrylate), Neopentyl methacrylate (or acrylate), 1-Bicyclo{2,2,2}octyl methacrylate (or acrylate) and their derivatives, 1-Bicyclo{2,2,1}heptyl methacrylate (or acrylate) and their derivatives, 1-Bicyclo{2,1,1}hexyl methacrylate (or acrylate) and their derivatives, 1-Bicyclo{1,1,1}pentyl methacrylate (or acrylate) and their derivatives, and 1-adamantyl methacrylate (or acrylate) and their derivatives.

Other types of pendant acid labile group used for the photoresist can be represented by the formula:

(2)

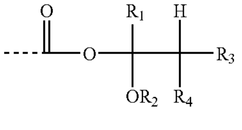

(3)

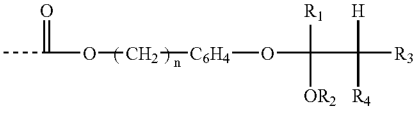

where $R_1$ is hydrogen or a lower alkyl; $R_2$ is a lower alkyl; and $R_3$ and $R_4$ are independently hydrogen or a lower alkyl, where the lower alkyl is defined as alkyl groups having 1 to 6 linear or cyclic carbon atoms, and the joining of (i) $R_1$ and $R_2$, or (ii) $R_1$ and either $R_3$ or R4, or (iii) $R_2$ and either $R_3$ or $R_4$ forms a 5-, 6-, or 7-membered ring.

Some examples of acid labile monomeric components used to prepare the polymer material according to embodiments of the present invention are 1-ehtoxyethyl methacrylate (or acrylate), 1-butoxyethyl methacrylate (or acrylate), 1-ethoxy-1-propyl methacrylate (or acrylate), tetrahydropyranyl methacrylate (or acrylate), tetrahydropyranyl p-vinylbenzoate, 1-ethoxy-1-propyl p-vinylbenzoate, 4-(2-tetrahydropyranyloxy)benzyl methacrylate (or acrylate), and 4-(1-butoxyethoxy)benzyl methacrylate (or acrylate).

The molecular weight of these polymers may be 7,000 to 1,000,000. It is also desirable to use copolymers, either random or block copolymers of monomer units containing the acid labile side groups and some other monomers which do not have acid labile pendant groups but have hydrophilic groups such as ethylene glycol ethers or carboxylic acid groups. Molecular weights higher than typical molecular weight of photoresist known in the field are preferred since the remaining polymer film has to withstand certain mechanical processes, such as screen printing. Mechanical stress is applied to the film with a rubber squeeze during or after the screen printing. In order to improve organic solvent resistance, it would be desirable to have a high amount of acid after the removal of the labile groups. The amount of monomer in the copolymer suitable for imperviousness to the organic vapor depends on the types of organic solvent used with the paste. The preferred mole fraction for the monomer containing labile ester group is more than or equal to 50%, and the more preferred mole percentage is higher than or equal to 60%.

The block copolymers can be prepared using commonly known methods, such as living or controlled polymerization, anionic or group transfer polymerization, and atom transfer polymerization. The terms and techniques regarding living, controlled, and atom transfer polymerization are discussed in "Controlled/Living Radical Polymerization", edited by K. Matyjaszewski, Oxford University Press. The random copolymers can be obtained by solution polymerization using typical free radical initiators such as organic peroxide and azo initiators. Discussion of these copolymerization methods can be found in "Polymer Chemistry" Fifth Edition by C. E. Carraher Jr, Marcel Dekker Inc., New York, N.Y. (see Chapters 7, 8 and 9) which is incorporated herein by reference or "Polymers" by S. L. Rosen in The Kirk-Othmer Encyclopedia of Chemical Technology, Fourth Edition, John Wiley and Sons Inc., New York (see volume 19, pp 899-901) which is incorporated herein by reference.

Photo initiator in the photoresist is selected from common photoacid generators such as aromatic sulfonium phosphofluoride or antimony fluoride, or aromatic iodonium salt with similar anions. The photoacid generator and examples of such compounds are described in a paper by J. V. Crivello, "The Chemistry of Photoacid Generating Compounds" in Polymeric Materials Science and Engineering, Vol. 61, American Chemical Society Meeting, Miami, Fla., Sep. 11-15, 1989, pp. 62-66 and references therein which are incorporated herein by reference. The selected photoacid generator should not be decomposed or dissolved during development. Nonionic photoacid generators such as PI-105 (Midori Kagaku Co, Tokyo, Japan) or high molecular weight photoacid generators such as Cyracure UVI 6976 (Dow, Midland, Mich.), CD-1012 (Aldrich Chemical, Milwaukee, Wis.) are examples of such photoacid generators. The photoresist may further include 0.5 to 30 mole % of photoacid generator.

To form a mask using the photoresist, a photoresist having pendant labile acid groups and photoinitiators is applied to coat a substrate to a thickness of 0.5 to 5 μm. Such coating may be performed by spin-coating or table coating using a blade and an appropriate organic solvent. The organic solvent for the coating of the photoresist may be propylene glycol 1-monomethyl ether 2-acetate (PGMEA) or cyclohexanone.

The organic solvent is dried by first heat-treatment for the substrate whereon the photoresist film is formed at 70 to 110° C. for typically 1 to 3 minutes on a hot plate. The photoresist film is exposed by ultra violet (UV) photo-irradiation to form a predetermined pattern. Second heat-treatment after the exposure (i.e., the UV photo-irradiation) can cleave the acid labile pendant groups to convert the ester to an acid. The UV photo-irradiation source may be 193 nm laser radiation or a mercury lamp because a wavelength higher than 248 nm may require addition of a small amount (10 to 1,000ppm) of photosensitizer which increases the absorption of the UV light. Examples of the photosensitizer may include isopropylthioxnanthone (ITX), 2,4-diethyl-9H-thioxanthen-9-one (DETX), and benzophenone.

An appropriate UV photo-irradiation dose is preferably 50 to 2,000 mJ/$cm^2$, more preferably 50 to 1,000 mJ/$cm^2$. The second baking process after the exposure is typically performed at 100 to 130° C., or alternatively 120 to 140° C., for 1 to 10 minutes. The second baking process results in the exposed region being soluble in an aqueous base developing solvent. The base developing solvent may include a carbonate solution or a low concentration sodium or potassium hydroxide solution. Commercial aqueous base developers such as AZ 300, 400, or 500 obtained from Clariant Corporation, AZ Electronic Materials Somerville, N.J. 08876-1258 may be used. After development, an unexposed remaining portion still has photosensitivity and has solubility in the aqueous base developing solvent due to the heat-treatment after exposure to light.

The photoresist is converted to a film having a high level of polycarboxylic acid which is insoluble in common organic solvents employed in thick film pastes by exposure to UV light and subsequent heat treatment. The UV photo-irradiation dose is 50 to 2,000 mJ/$cm^2$. The second baking process after exposure to light is typically performed at 120 to 140° C. for 1 to 3 minutes.

Hereinafter, experimental results to investigate the possibility of re-exposure and re-development of a photoresist film which has undergone the first exposure and development will be described.

Figure 2A:
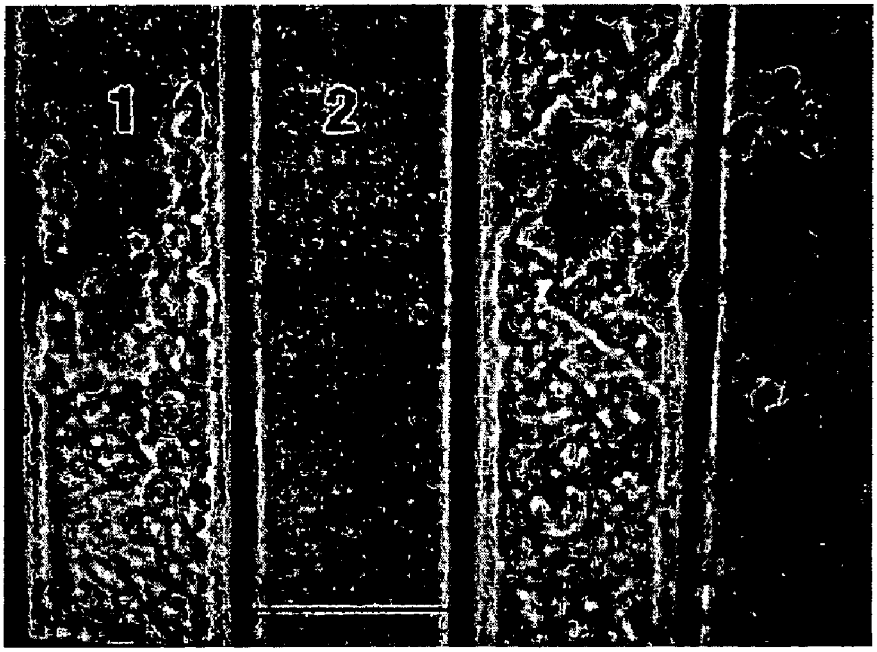
FIGS. 2A through 2D are photographic images illustrating characteristics of a photoresist for performing multi-patterning according to an embodiment of the present invention.
Figure 2B:
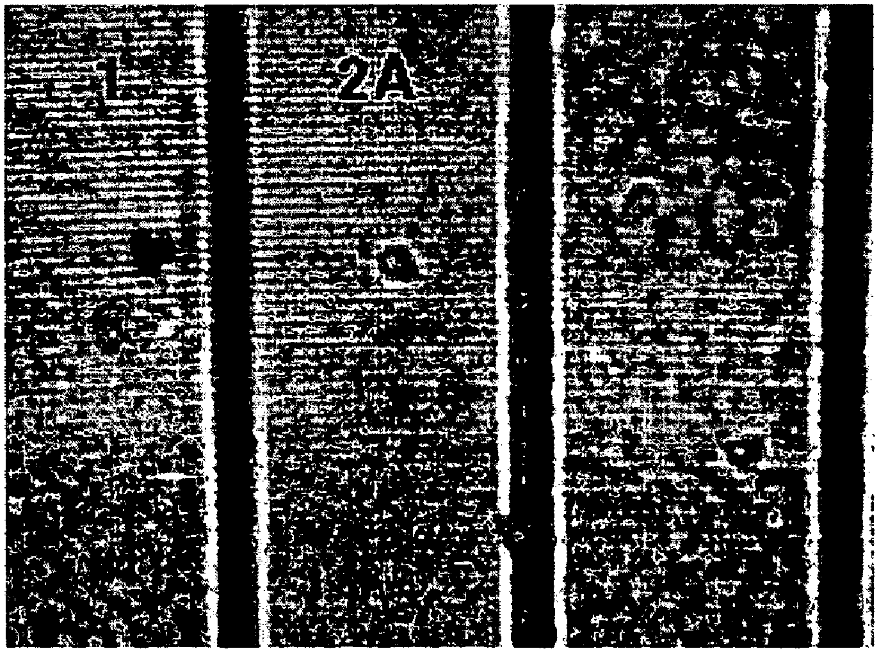
Figure 2C:
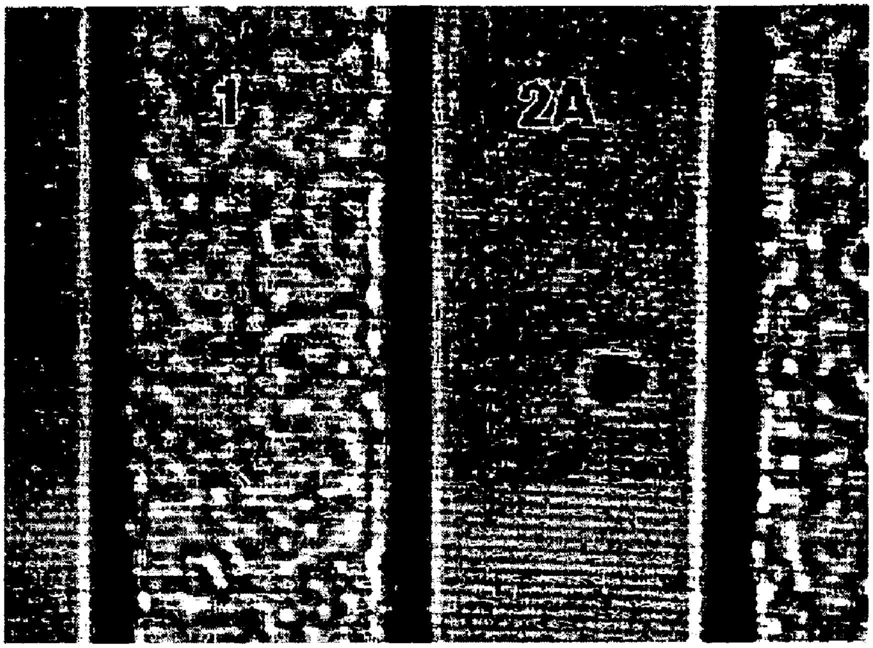
Figure 2D:
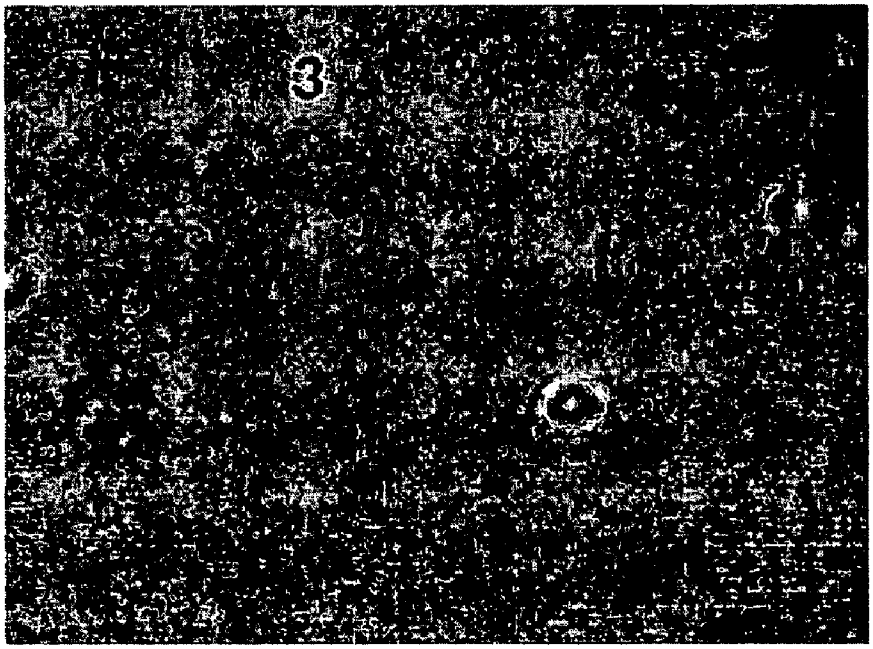

A square film was placed in a Plexiglas® sample holder and backwardly supported by a KAPTON® (DuPont, Wilmington, Del.) film. A 50-micron photomask grid was placed over the top of the film and fixed at a predetermined position using a large glass disk. The film was exposed to UV light for 120 seconds. The exposed film was then heated at 110° C. for 10 minutes on a hot plate. The film was washed for 60 seconds using a spray gun with a 0.5% solution of sodium carbonate, and then rinsed with distilled water for 30 seconds. The film was dried with a stream of $N_2$. FIG. 2A shows an alternating grid of UV irradiated and unirradiated film. In a region 1 of FIG. 2A, the irradiated film was dissolved by the carbonate solution. In a region 2 of FIG. 2A, which is unirradiated, the film was still present. The film was then heated at 110° C. for 10 minutes on a hot plate. The film was exposed a second time for 120 second with no photomask. The film was then heated again at 110° C. for 10 minutes on a hot plate. FIG. 2B shows the film after UV-irradiation. A region 2A of FIG. 2B was photo-irradiated. The surface of the film was washed with ethyl acetate and soaked on a Q-Tip, and dried. The ethyl acetate stimulates the solvents present in a thick film paste. FIG. 2C shows that the region 2A of the film is still intact after exposure to the ethyl acetate. The film was washed for 60 seconds using a spray gun with a 0.5% solution of sodium carbonate, and then, rinsed with distilled water for 30 seconds. The film was dried with a stream of $N_2$. FIG. 2D shows all of the film has been dissolved.

Figure 3A:
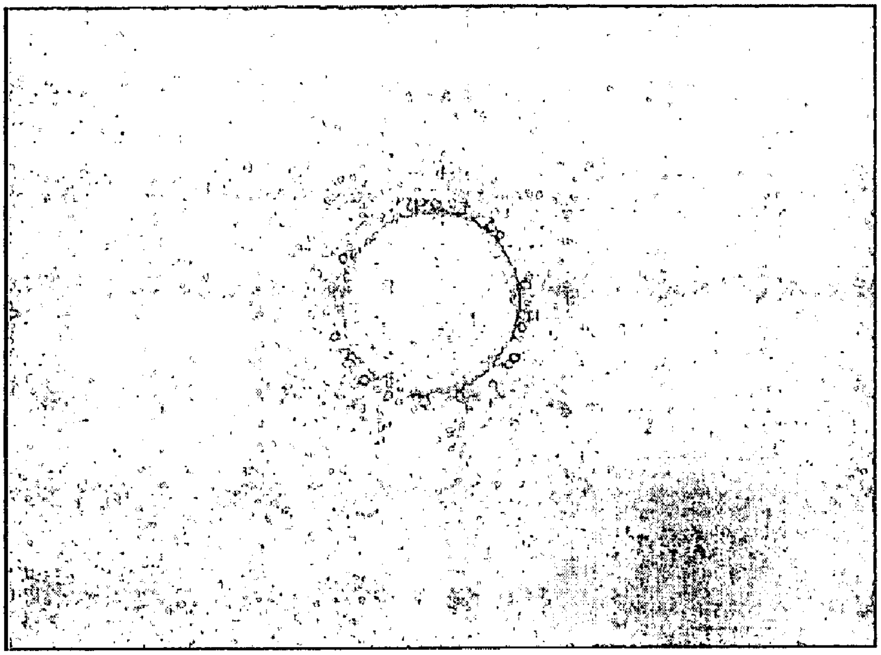
FIGS. 3A and 3B are images illustrating the multi-patterning using a single photoresist according to an embodiment of the present invention.
Figure 3B:
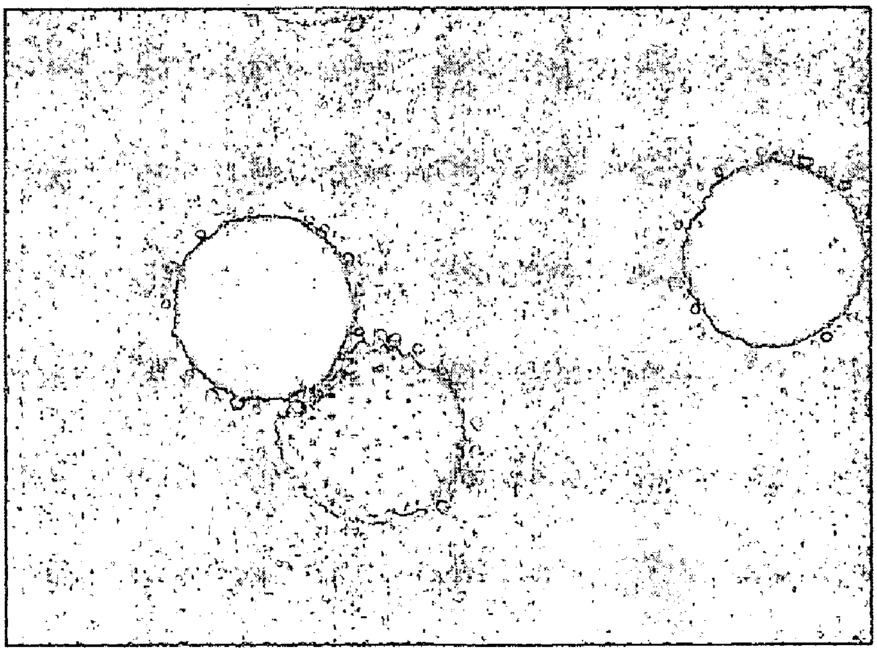

FIGS. 3A and 3B show results of the multi-pattering using a single photoresist film performed using the above-described method. FIG. 3A is an image of the photoresist film after the first patterning. FIG. 3B is an image of the photoresist film after the second patterning.

Hereinafter, a method of manufacturing a FED using a photoresist with which multi-patterning can be performed, according to an embodiment of the present invention will be described.

Figure 4A:
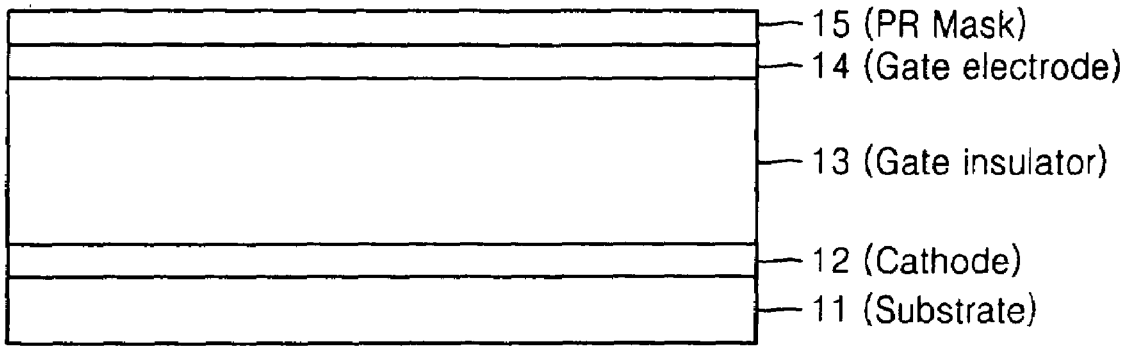
FIGS. 4A through and 4J and 5A through 5F are cross-sectional views illustrating a method of manufacturing a FED according to an embodiment of the present invention.

FIGS. 4A through and 4J and 5A through 5F are cross-sectional views illustrating a method of manufacturing a FED according to an embodiment of the present invention. Referring to FIG. 4A, a photoresist mask (PR mask) 15 is formed on a top surface of a substrate 11 on which at least one patterning target material layer is stacked. The photoresist mask 15 is formed using, for example, spin-coating, and heat-treated, i.e., soft-baked, at a predetermined temperature. On the substrate 11 in FIG. 4A is formed a basic stacked structure for a FED. A cathode 12 having a predetermined pattern is formed on the substrate 11, and a gate insulation layer (gate insulator) 13, which is an uncompleted patterning target material layer is formed on the cathode 12. A gate electrode 14, which is also a patterning target material layer, is formed on the gate insulation layer 13. A photoresist mask 15 is formed on the gate insulation layer 13 and the gate electrode 14 made of metal, for example, chromium, to pattern the gate insulation layer 13 and the gate electrode 14.

The photoresist mask 15 is formed by, for example, spin-coating, and heat-treated, i.e., soft-baked, at a predetermined temperature. The photoresist mask 15 is formed using positive photoresist having the previously-described characteristics. That is, the photoresist mask 15 can be multi-exposed and multi-developed, and has a solubility after post-exposure heat treatment. The unexposed portion of the photoresist mask 15 still has photosensitivity regardless of the heat-treatment.

Figure 4B:
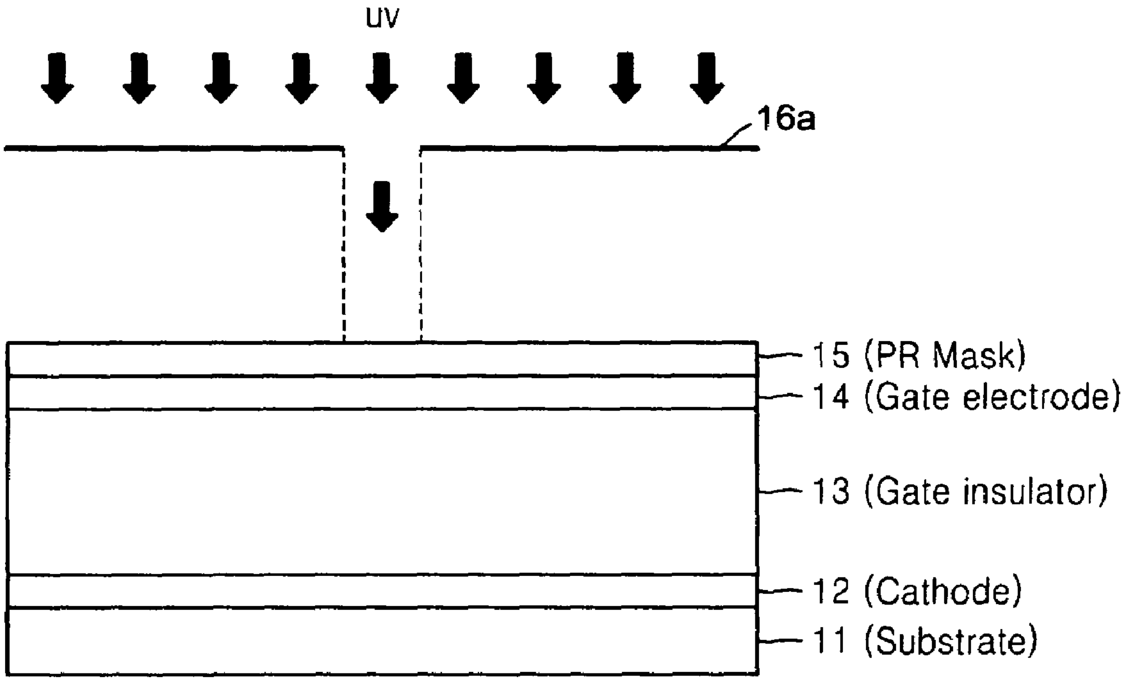

Referring to FIG. 4B, the photoresist mask 15 is exposed to form a predetermined pattern using an additional reticle 16*a*. As described above, the photoresist mask 15 is heat-treated at a predetermined temperature after the exposure. This is referred to as post-exposure baking. After the heat-treatment, the exposed portion of the photoresist mask 15 has a solubility to a predetermined solvent.

Figure 4C:
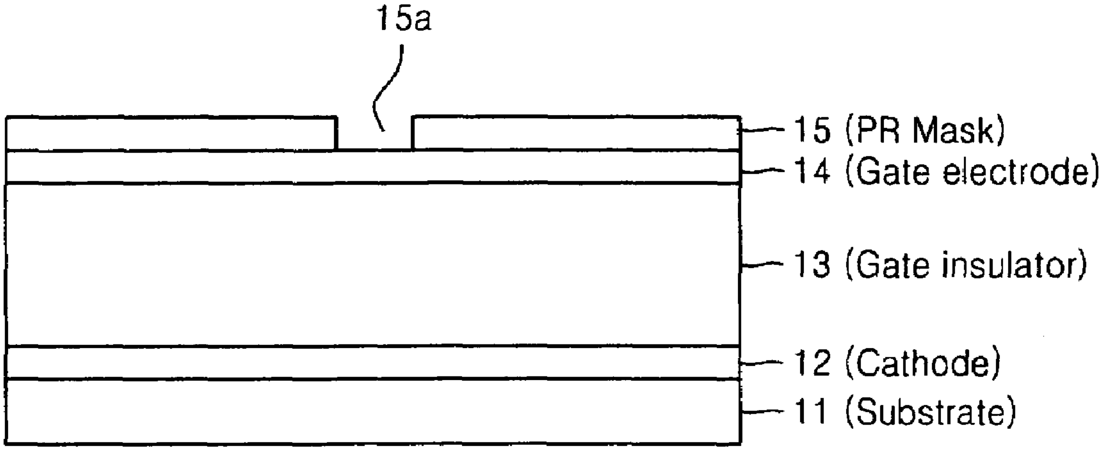

Referring to FIG. 4C, the exposed portion of the photoresist mask 15, which having a solubility due to the heat-treatment is etched with a predetermined solvent. The photoresist mask 15 is developed by the selective etching using the solvent such that an etch window 15*a*, which is for etching lower layers including the gate electrode 14 and the gate insulation layer 13, is formed in the photoresist mask 15.

Figure 4D:
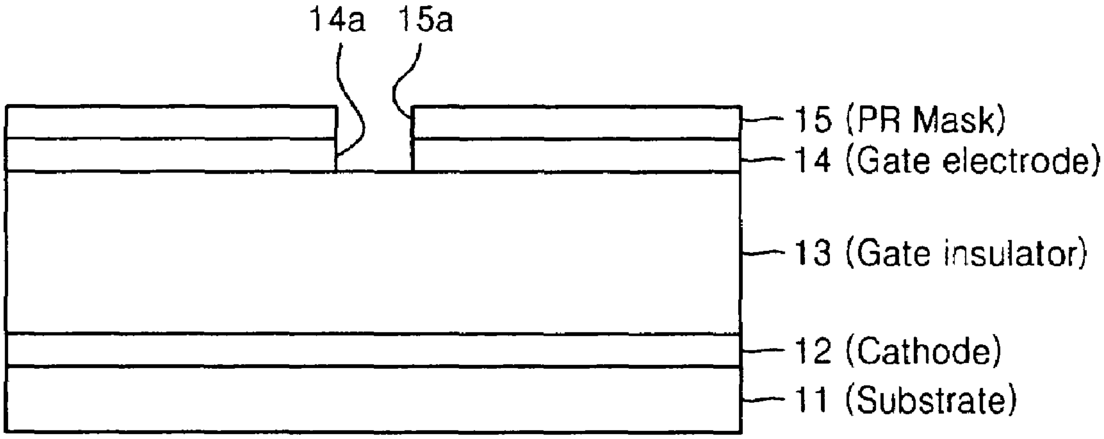

Referring to FIG. 4D, a portion of the gate electrode 14 exposed through the etch window 15*a* is etched to form a gate hole 14*a*. An etchant having a solubility with respect to metals is used to etch the gate electrode 14. After the etching, a portion of the gate insulation layer 13 is exposed through the gate hole 14*a*.

Figure 4E:
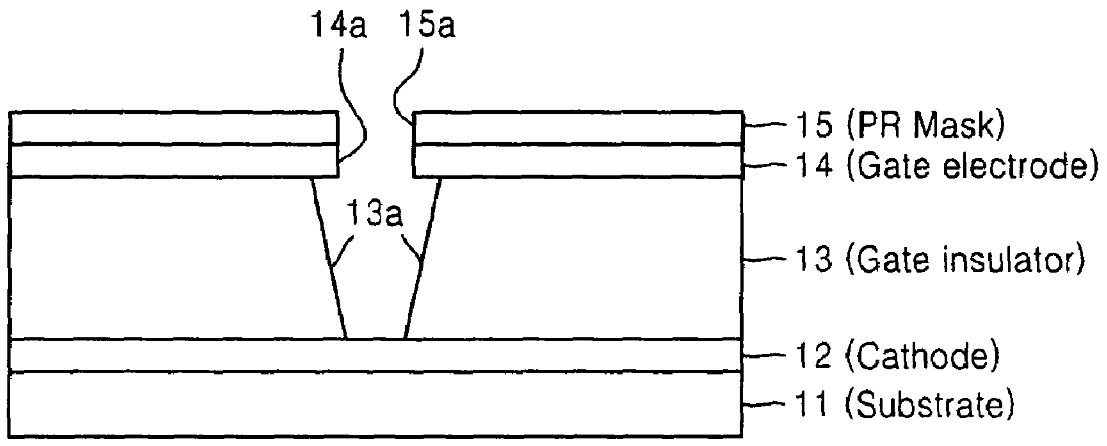

Referring to FIG. 4E, the gate insulation layer 13 is etched by supplying an anisotropic etchant through the gate hole 14*a* to form a through-hole 13*a*. The supply of the etchant through the gate hole 14*a* is substantially performed by dipping the substrate 11 in the etchant. In FIG. 4E, the through-hole 13*a* formed in the gate insulation layer 13 is trapezoidal-shaped in a sectional view, such that the upper portion is wider than the lower portion, and the upper portion of the through-hole 13*a* has a larger diameter than the gate hole 14*a*. The through-hole 13*a*, however, may have various other shapes.

Figure 4F:
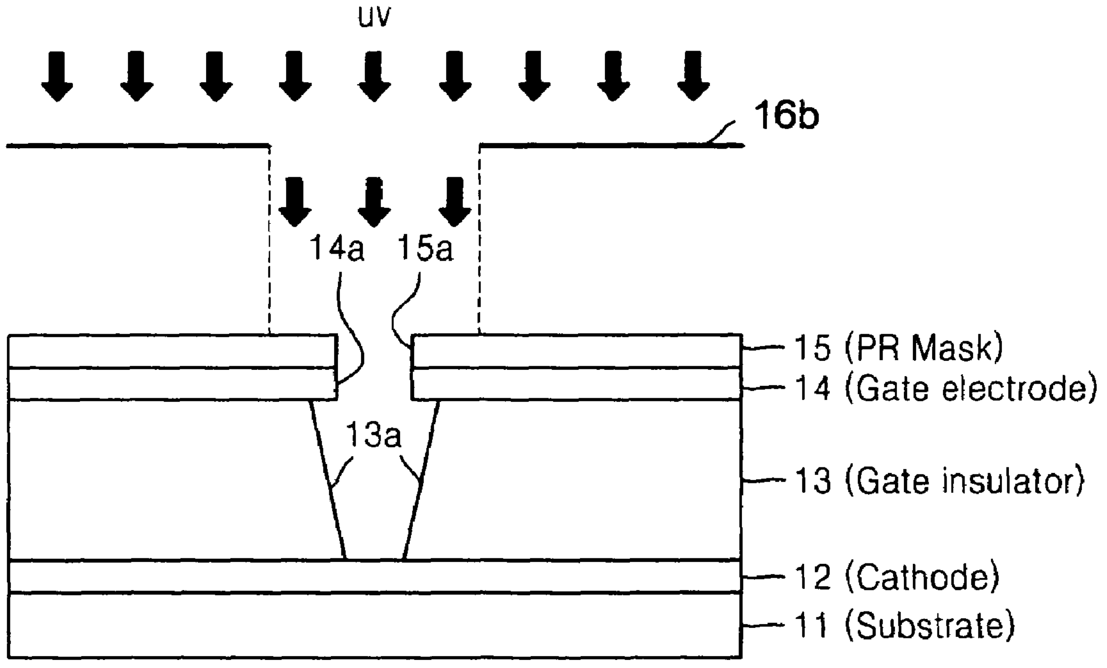

Referring to FIG. 4F, the photoresist mask 15 is second exposed to UV light, using another reticle 16*b*. The second exposure is performed onto a larger region including the gate hole 14*a* to enlarge the gate hole 14*a*. The region formed by the second exposure is concentric with the gate hole 14*a*. After the second exposure, a second baking process is performed at a predetermined temperature, for example, 100 to 130° C. to provide a solubility to the second exposed portion.

Figure 4G:
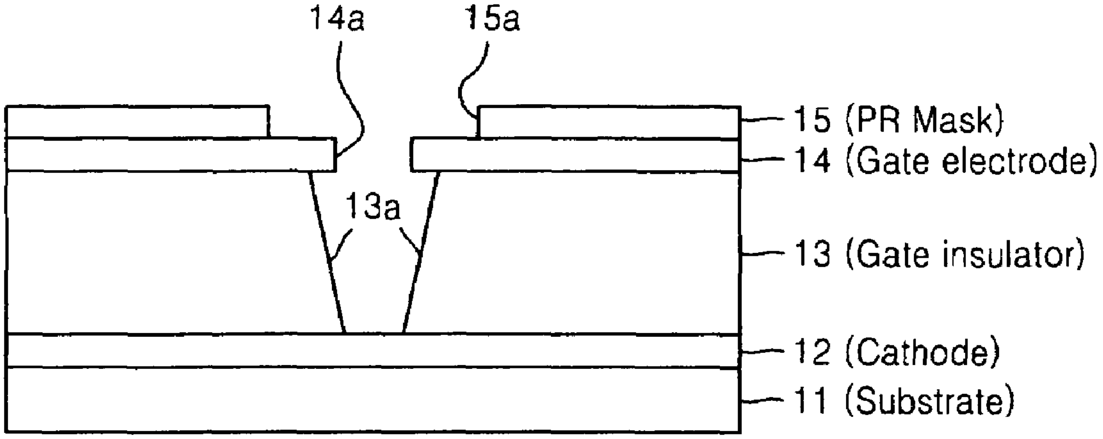

Referring to FIG. 4G, the portion having the solubility due to the second exposure and the second baking process is patterned such that the etch window 15*a* in the photoresist mask is enlarged. An edge portion of the gate hole 14*a* in the gate electrode 14 is exposed through the enlarged etch window 15*a*.

Figure 4H:
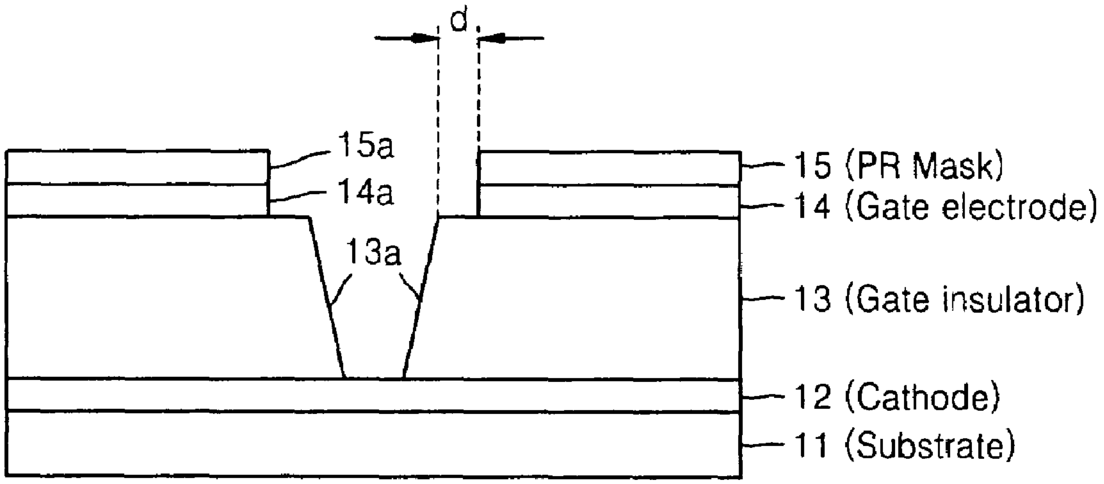

Referring to FIG. 4H, the edge portion of the gate hole 14*a* in the gate electrode 14 uncovered by the photoresist mask 15 is etched to enlarge the gate hole 14*a* so that the edge of the enlarged gate hole 14*a* is distanced from the top edge of the through-hole 13*a* in the gate insulation layer 13 by a predetermined distance d.

Figure 4I:
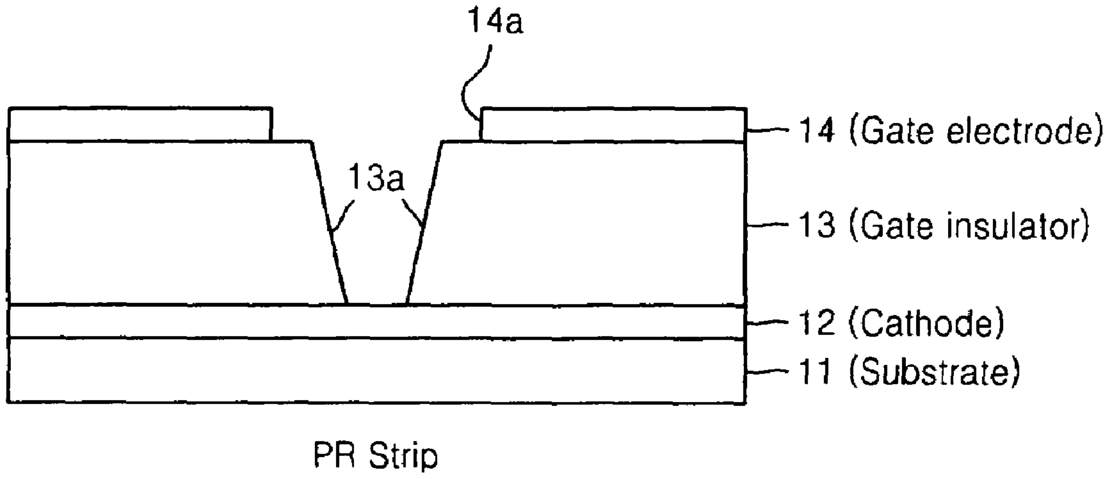

Referring to FIG. 4I, the photoresist mask 15 is removed. Therefore, the gate electrode 14 and the gate insulation layer 13 are patterned using the single photoresist mask 15, and thus the gate insulation layer 13 having the through-hole 13*a* of a desired shape and the gate electrode 14 having the gate hole 14*a* of a desired shape are formed.

Figure 4J:
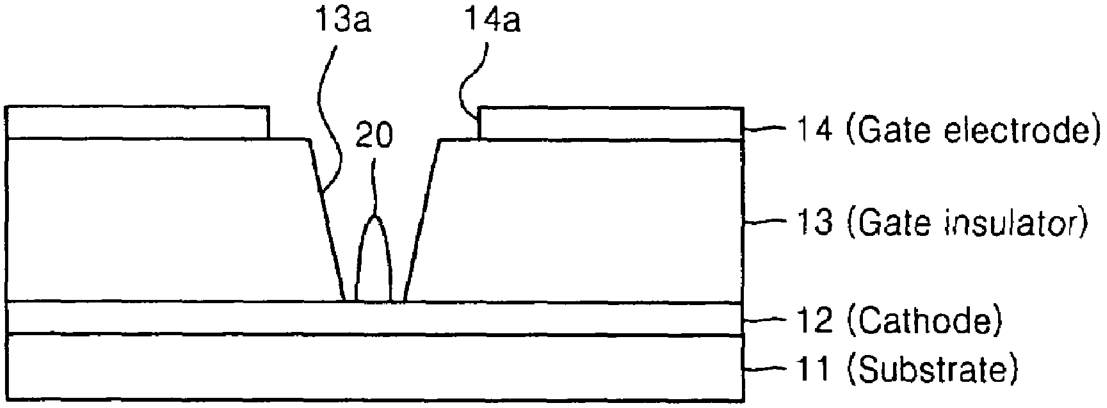

Referring to FIG. 4J, an electron emitting material layer 20 is formed on an upper surface of the cathode 12 exposed by the through-hole 13*a*. The electron emitting material layer 20 is deposited on the cathode using, for example, a chemical vapor deposition (CVD) method, or is a carbon nano tube (CNT) structural material that is formed by being applied as a paste and patterning the paste.

According to the present embodiment of the present invention the above-described operations in FIGS. 4A through 4H are optional in order to obtain the structure of FIG. 4I. That is, conventional operations other than the operations described with reference to FIGS. 4A through 4H may be performed.

FIG. 5A through 5F illustrate a method of forming an electron emitting material layer using a carbon nano paste in the structure of FIG. 4I of a FED using a positive photoresist having a solubility only by exposure to light according to an present embodiment of the present invention.

Figure 5A:
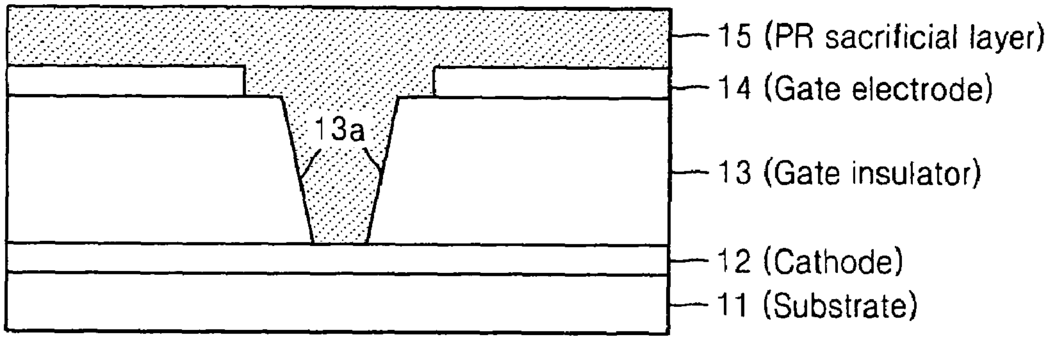

Referring to FIG. 5A, the above-described positive photoresist having a solubility only by exposure to light is coated on the gate electrode 14 to form a sacrificial layer 15. The coated sacrificial layer 15 fills the gate hole 13*a*. The sacrificial layer 15 is first baked, preferably, soft baked, at a predetermined temperature in operation 9.

Figure 5B:
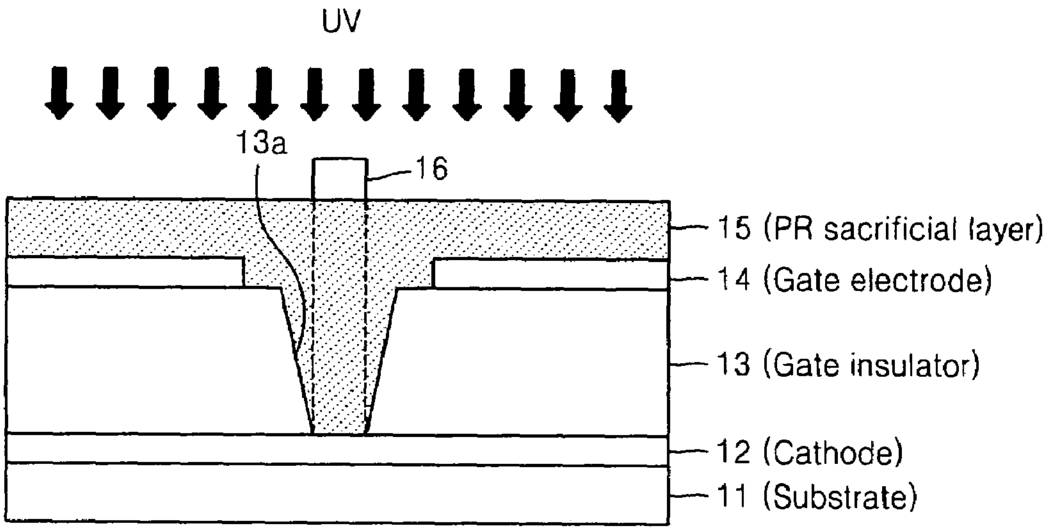

Referring to FIG. 5B, a photomask 16 is formed on the sacrificial layer 15 and above the gate hole 13*a*, and then the entire surfaces of the sacrificial layer 15 and the photomask 16 are exposed to UV light.

Figure 5C:
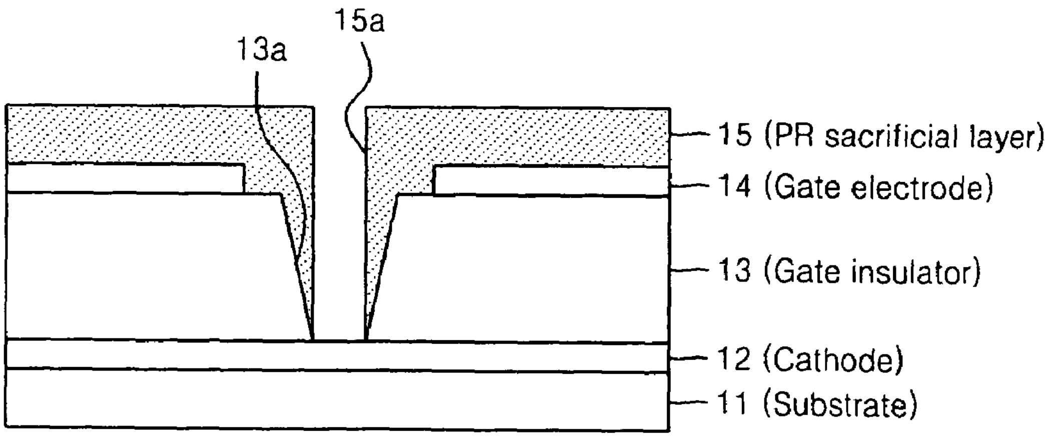

Referring to FIG. 5C, after the exposure to UV light, second baking is performed and then etching is performed using TCE or $CH_2Cl_2$. The etching is performed by dipping the substrate in a solvent and rinsing with water. As described above, only the unexposed portion of the sacrificial layer 15 has a solubility to the non-polar solvent, for example, such as TCE or $CH_2Cl_2$, such that a well 15*a* corresponding the gate hole 13*a* is formed in the sacrificial layer 15.

Figure 5D:
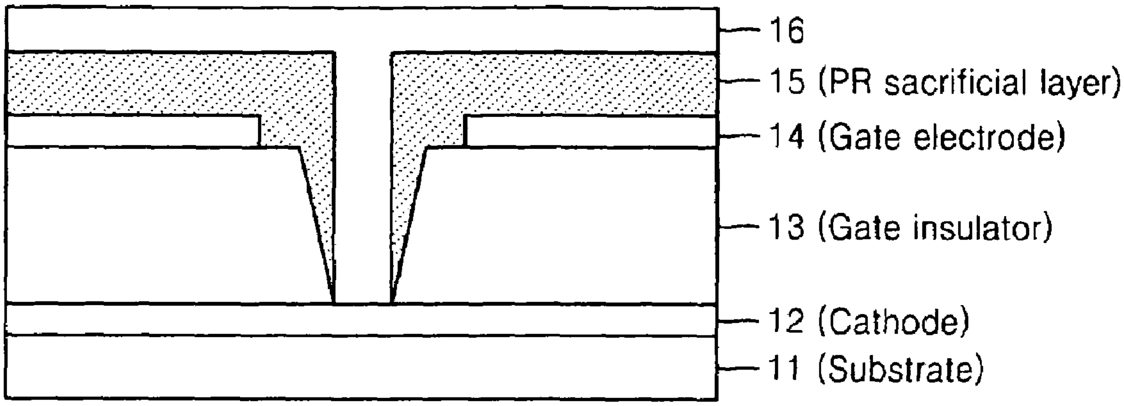

Referring to FIG. 5D, a carbon nanotube (CNT) paste 16 is applied to the sacrificial layer 15, and thus, the well 15*a* is filled with the CNT paste 16. The CNT paste 16 is applied using a squeegee or a printing method, and the CNT paste 16 includes a light-hardened photoresist.

Figure 5E:
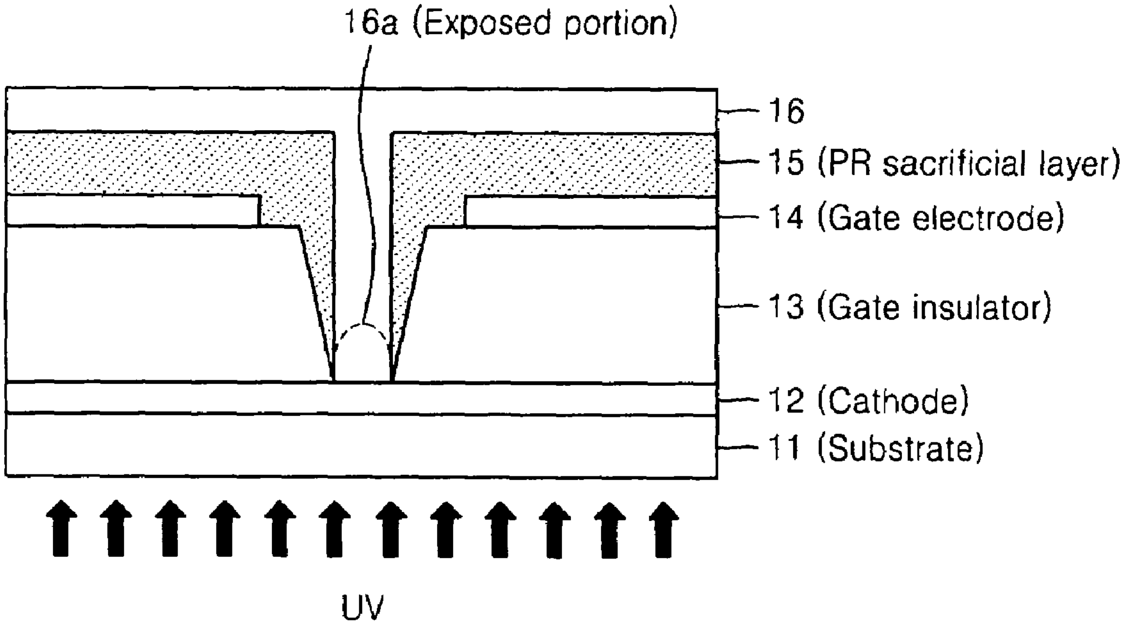

Referring to FIG. 5E, flood exposure to light is performed from the bottom of the substrate 11 to harden a lower portion 16*a* of the CNT paste 16 filled in the well 15*a*.

Figure 5F:
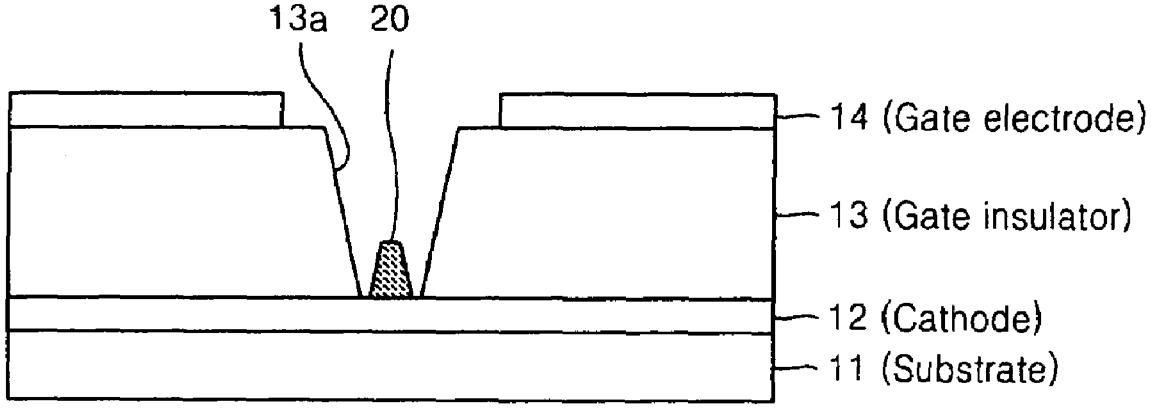

Referring to FIG. 5F, the sacrificial layer 15 is removed, and thus the unexposed portions of the CNT paste 16 disposed on the sacrificial layer 15 and in the well 15*a* are removed. Therefore, the formation of the electron emitting material layer 20 in the FED is completed.

In the method of manufacturing a FED according to an embodiment of the present invention, two stacked layers are patterned using a single photoresist mask, thereby reducing the number of manufacturing operations to obtain a desired structure, compared with conventional methods in which each layer is patterned using a respective mask. In a conventional method of manufacturing a FED, in order to form a gate well, a gate hole is formed in a gate electrode through a photolithography process using a first mask, a through-hole is formed in a gate insulation layer, an additional photoresist mask is formed such that an edge of the gate hole is separated from an upper aperture of the through-hole in the gate insulation layer, thereby enlarging the gate hole in the gate electrode using the photomask. Since the conventional method needs additional operations of forming and removing the additional photomask, it has more operations than the method of the present invention. Furthermore, photoresist materials for forming the second photoresist mask which is formed to enlarge the gate hole may be deposited in the through-hole in the gate insulation layer which is formed using the first photoresist mask. The photoresist material deposited in the through-hole during the formation of the second photoresist mask should be completely removed after the enlargement of the gate hole. However, the complete dissolution of the photoresist deposited in the narrow through-hole requires a long etchant supply time, and thus unexpected damage to the structure may occur due to the long etchant supply time. However, according to the present invention, any materials cannot be deposited in the previously formed through-hole, and thus, the above-described problem does not occur. Such advantages of the photoresist are shown in the formation of the above-described electron emitting material layer.

In the method of the present invention, a photomask for performing multi-patterning is used, thereby obtaining a desired structure using a simple process compared to the conventional methods. For example, a conventional method of manufacturing a FED needs fifteen operations, but the method of the present invention needs twelve operations. The reduction of the number of operations decreases manufacturing costs. In particular, according to the method of the present invention, a problem of photoresist penetration does not occur and very clean structures are obtained, as described above.

The method according to the present invention can be applied to manufacture electronic devices in which the formation of a predetermined patterned film or a 3-dimensional structure is required. In particular, the method can be applied to manufacture display apparatuses, for example, FEDs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming stacked layers in an electronic device, comprising:

preparing a multi-layer structure comprising a substrate, a cathode on the substrate, a gate electrode having a through-hole, and a gate insulation layer disposed between the cathode and the gate electrode and having a gate hole corresponding to the through-hole;

forming a sacrificial layer by coating a positive photoresist having polymers on the multi-layer structure, the polymers comprising at least 50 mole % of monomers having structures selected from the group consisting of Formulae 1 through 3;

forming a photomask on a position of the sacrificial layer corresponding to the gate hole;

exposing a portion of the sacrificial layer uncovered by the photomask to light;

forming a well in the sacrificial layer by etching the unexposed portion of the sacrificial layer covered by the photomask using one of TCE and $CH_2Cl_2$ solvents;

filling the well by applying an electron emitting material paste which is able to be hardened by light to the sacrificial layer;

hardening a lower portion of the electron emitting material paste filled in the well by radiating light from the bottom of the substrate; and forming an electron emitting material layer having a predetermined height on the cathode by removing the sacrificial layer and the unexposed electron emitting material paste:

(1)

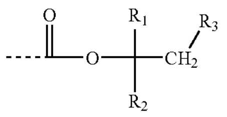

where $R_1$ is hydrogen or an alkyl group having 1 to 6 linear or cyclic carbon atoms, $R_2$ is an alkyl group having 1 to 6 linear or cyclic carbon atoms, and $R_3$ is hydrogen or an alkyl group having 1 to 6 linear or cyclic carbon atoms;

(2)

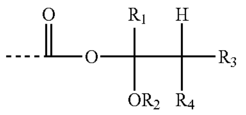

where $R_1$ is hydrogen or an alkyl group having 1 to 6 linear or cyclic carbon atoms, $R_2$ is an alkyl group having 1 to 6 linear or cyclic carbon atoms, and $R_3$ and $R_4$ are independently hydrogen or an alkyl group having 1 to 6 linear or cyclic carbon atoms, and the joining of $R_1$ and $R_2$, or $R_1$ and either $R_3$ or $R_4$, or $R_2$ and either $R_3$ or $R_4$ forms a 5-, 6-, or 7-membered ring, (3)

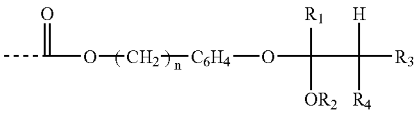

where $R_1$ is hydrogen or an alkyl group having 1 to 6 linear or cyclic carbon atoms, $R_2$ is an alkyl group having 1 to 6 linear or cyclic carbon atoms, and $R_3$ and $R_4$ are independently hydrogen or an alkyl group having 1 to 6 linear or cyclic carbon atoms, and the joining of $R_1$ and $R_2$, or $R_1$ and either $R_3$ or $R_4$, or $R_2$ and either $R_3$ or $R_4$ forms a 5-, 6-, or 7-membered ring.

2. The method of claim 1, wherein the preparation of the multi-layer structure comprises:

forming the cathode on the substrate;

sequentially forming the gate insulation layer and the gate electrode on the cathode;

forming a mask layer by coating a photoresist on the gate electrode layer;

first baking the mask layer at a first temperature;

exposing the mask layer to light with a predetermined pattern;

second baking the mask layer at a second temperature;

developing the mask layer to form an etch window in the mask layer;

etching the gate electrode through the etch window;

repeating at least twice the exposing to the developing; and removing the mask layer.

3. The method of claim 2, wherein the second temperature is 100 to 130° C.

4. The method of claim 1, wherein the polymer is selected from the group consisting of 1-ehtoxyethyl methacrylate, 1-ehtoxyethyl acrylate, 1-butoxyethyl methacrylate, 1-butoxyethyl acrylate, 1-ethoxy-1-propyl methacrylate, 1-ethoxy-1-propyl acrylate, tetrahydropyranyl methacrylate, tetrahydropyranyl acrylate, tetrahydropyranyl p-vinylbenzoate, 1-ethoxy-1-propyl p-vinylbenzoate, 4-(2-tetrahydropyranyloxy)benzyl methacrylate, 4-(2-tetrahydropyranyloxy)benzyl acrylate, 4-(1-butoxyethoxy)benzyl methacrylate, 4-(1-butoxyethoxy)benzyl acrylate, t-butyl methacrylate, t-butyl acrylate, neopentyl methacrylate, neopentyl acrylate, 1-Bicyclo{2,2,2}octyl methacrylate (or acrylate) and their derivatives, 1-Bicyclo{2,2,1}heptyl methacrylate (or acrylate) and their derivatives, 1-Bicyclo{2,1,1}hexyl methacrylate (or acrylate) and their derivatives, 1-Bicyclo{1,1,1}pentyl methacrylate (or acrylate) and their derivatives, and 1-adamantyl methacrylate (or acrylate) and their derivatives.

5. The method of claim 4, wherein the photoresist further comprises 0.5 to 30 mole % of photoacid generator and 10 to 1,000 ppm of photosensitizer.

6. The method of claim 1, wherein the photoresist further comprises 0.5 to 30 mole % of photoacid generator and 10 to 1,000 ppm of photosensitizer.

7. The method of claim 1, wherein the electron emitting material paste is a carbon nanotube paste.

8. A method of forming an electron emitting material layer in an electronic device having a multi-layer structure, comprising:

preparing the multi-layer structure, the multi-layer structure comprising a substrate, a cathode formed on the substrate, a first layer on the cathode, and a second layer on the first layer, the first layer having a first hole exposing a portion of the cathode, the second layer having a second hole corresponding to the first hole;

applying photoresist to the multi-layer structure to form a photoresist layer which is formed on the second layer and fills the first hole and the second hole, the photoresist having polymers comprising at least 50 mole % of monomers having structures selected from the group consisting of Formulae 1 through 3;

first baking the photoresist layer at a first temperature range;

positioning a photomask on the photoresist layer at a position above the exposed portion of the cathode;

exposing the photoresist layer to light;

second baking the photoresist layer at a second temperature range;

removing an unexposed portion of the photoresist layer to form a well in the photoresist layer;

filling the well by applying an electron emitting material paste which is able to be hardened by light;

hardening a lower portion of the filled electron emitting material paste by radiating light from the bottom of the substrate; and removing the photoresist layer and the unexposed electron emitting material paste to form an electron emitting material layer on the cathode:

(1)

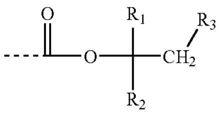

where $R_1$ is hydrogen or an alkyl group having 1 to 6 linear or cyclic carbon atoms, $R_2$ is an alkyl group having 1 to 6 linear or cyclic carbon atoms, and $R_3$ is hydrogen or an alkyl group having 1 to 6 linear or cyclic carbon atoms;

(2)

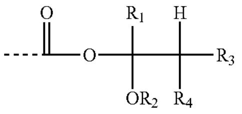

where $R_1$ is hydrogen or an alkyl group having 1 to 6 linear or cyclic carbon atoms, $R_2$ is an alkyl group having 1 to 6 linear or cyclic carbon atoms, and $R_3$ and $R_4$ are independently hydrogen or an alkyl group having 1 to 6 linear or cyclic carbon atoms, and the joining of $R_1$ and $R_2$, or $R_1$ and either $R_3$ or $R_4$, or $R_2$ and either $R_3$ or $R_4$ forms a 5-, 6-, or 7-membered ring; and (3)

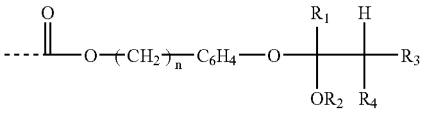

where $R_1$ is hydrogen or an alkyl group having 1 to 6 linear or cyclic carbon atoms, $R_2$ is an alkyl group having 1 to 6 linear or cyclic carbon atoms, and $R_3$ and $R_4$ are independently hydrogen or an alkyl group having 1 to 6 linear or cyclic carbon atoms, and the joining of $R_1$ and $R_2$, or $R_1$ and either $R_3$ or $R_4$, or $R_2$ and either $R_3$ or $R_4$ forms a 5-, 6-, or 7-membered ring.

9. The method of claim 8, wherein the polymer in the photoresist is selected from the group consisting of 1-ehtoxyethyl methacrylate, 1-ehtoxyethyl acrylate, 1-butoxyethyl methacrylate, 1-butoxyethyl acrylate, 1-ethoxy-1-propyl methacrylate, 1-ethoxy-1-propyl acrylate, tetrahydropyranyl methacrylate, tetrahydropyranyl acrylate, tetrahydropyranyl p-vinylbenzoate, 1-ethoxy-1-propyl p-vinylbenzoate, 4-(2-tetrahydropyranyloxy)benzyl methacrylate, 4-(2-tetrahydropyranyloxy)benzyl acrylate, 4-(1-butoxyethoxy)benzyl methacrylate, 4-(1-butoxyethoxy)benzyl acrylate, t-butyl methacrylate, t-butyl acrylate, neopentyl methacrylate, neopentyl acrylate, 1-Bicyclo{2,2,2}octyl methacrylate (or acrylate) and their derivatives, 1-Bicyclo{2,2,1}heptyl methacrylate (or acrylate) and their derivatives, 1-Bicyclo{2,1,1}hexyl methacrylate (or acrylate) and their derivatives, 1-Bicyclo{1,1,1}pentyl methacrylate (or acrylate) and their derivatives, and 1-adamantyl methacrylate (or acrylate) and their derivatives.

10. The method of claim 8, wherein the polymer has a molecular weight of 7,000 to 1,000,000.

11. The method of claim 8, wherein the first temperature range is from 70 to 100° C.

12. The method of claim 8, wherein the second temperature range is from 100 to 130° C.

13. The method of claim 8, wherein the electronic device is a field emission device, the second layer is a gate electrode, the first layer is a gate insulation layer, the second hole is a through-hole, and the first hole is a gate hole.

14. The method of claim 8, wherein the first hole is trapezoidal-shaped in a sectional view, and an upper portion of the first hole is wider than a lower portion of the first hole, and the upper portion of the first hole has a larger diameter than the second hole.

15. The method of claim 8, wherein the electron emitting material paste is a carbon nanotube paste.

16. A method of forming a field emission device, comprising:

preparing a precursor of the field emission device, the precursor comprising a substrate, a cathode on the substrate, a gate electrode having a through-hole, and a gate insulation layer disposed between the cathode and the gate electrode and having a gate hole corresponding to the through-hole, the gate hole having a trapezoidal-shape in a sectional view, a top portion of the gate hole being wider than a bottom portion of the gate hole, the upper portion of the gate hole having a larger diameter than the through-hole;

forming a sacrificial layer to cover the gate electrode and fill the gate hole and the through-hole, the sacrificial layer comprising polymers on the precursor, the polymers comprising at least 50 mole % of monomers having structures selected from the group consisting of Formulae 1 through 3;

soft-baking the sacrificial layer at a first temperature range;

positioning a photomask on a position of the sacrificial layer corresponding to the bottom of the gate hole;

exposing a portion of the sacrificial layer uncovered by the photomask to light;

hard-baking the sacrificial layer at a second temperature range;

developing the unexposed portion of the sacrificial layer covered by the photomask using one of TCE and $CH_2Cl_2$ solvents to form a well in the sacrificial layer;

filling the well by applying an electron emitting material paste including a light-hardened photoresist to the sacrificial layer;

hardening a lower portion of the electron emitting material paste filled in the well by radiating light from the bottom of the substrate; and removing the sacrificial layer and the unexposed electron emitting material paste to form an electron emitting material layer on the cathode:

(1)

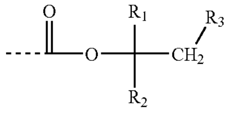

where $R_1$ is hydrogen or an alkyl group having 1 to 6 linear or cyclic carbon atoms, $R_2$ is an alkyl group having 1 to 6 linear or cyclic carbon atoms, and $R_3$ is hydrogen or an alkyl group having 1 to 6 linear or cyclic carbon atoms;

(2)

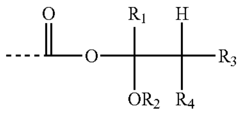

where $R_1$ is hydrogen or an alkyl group having 1 to 6 linear or cyclic carbon atoms, $R_2$ is an alkyl group having 1 to 6 linear or cyclic carbon atoms, and $R_3$ and $R_4$ are independently hydrogen or an alkyl group having 1 to 6 linear or cyclic carbon atoms, and the joining of $R_1$ and $R_2$, or $R_1$ and either $R_3$ or $R_4$, or $R_2$ and either $R_3$ or $R_4$ forms a 5-, 6-, or 7-membered ring; and (3)

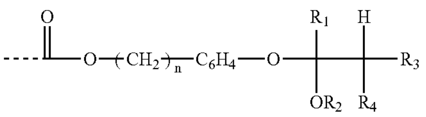

where $R_1$ is hydrogen or an alkyl group having 1 to 6 linear or cyclic carbon atoms, $R_2$ is an alkyl group having 1 to 6 linear or cyclic carbon atoms, and $R_3$ and $R_4$ are independently hydrogen or an alkyl group having 1 to 6 linear or cyclic carbon atoms, and the joining of $R_1$ and $R_2$, or $R_1$ and either $R_3$ or $R_4$, or $R_2$ and either $R_3$ or $R_4$ forms a 5-, 6-, or 7-membered ring.

17. The method of claim 16, wherein the polymer in the photoresist is selected from the group consisting of 1-ehtoxyethyl methacrylate, 1-ehtoxyethyl acrylate, 1-butoxyethyl methacrylate, 1-butoxyethyl acrylate, 1-ethoxy-1-propyl methacrylate, 1-ethoxy-1-propyl acrylate, tetrahydropyranyl methacrylate, tetrahydropyranyl acrylate, tetrahydropyranyl p-vinylbenzoate, 1-ethoxy-1-propyl p-vinylbenzoate, 4-(2-tetrahydropyranyloxy)benzyl methacrylate, 4-(2-tetrahydropyranyloxy)benzyl acrylate, 4-(1-butoxyethoxy)benzyl methacrylate, 4-(1-butoxyethoxy)benzyl acrylate, t-butyl methacrylate, t-butyl acrylate, neopentyl methacrylate, neopentyl acrylate, 1-Bicyclo{2,2,2}octyl methacrylate (or acrylate) and their derivatives, 1-Bicyclo{2,2,1}heptyl methacrylate (or acrylate) and their derivatives, 1-Bicyclo{2,1,1}hexyl methacrylate (or acrylate) and their derivatives, 1-Bicyclo{1,1,1}pentyl methacrylate (or acrylate) and their derivatives, and 1-adamantyl methacrylate (or acrylate) and their derivatives.

18. The method of claim 16, wherein the polymer has a molecular weight of 7,000 to 1,000,000.

19. The method of claim 16, wherein the first temperature range is from 70 to 100° C., and the second temperature range is from 100 to 130° C.

20. The method of claim 16, wherein the electron emitting material paste is a carbon nanotube paste.

* * * * *